(12) United States Patent
Izradel

(10) Patent No.: US 12,199,558 B2
(45) Date of Patent: Jan. 14, 2025

(54) SOLAR PANELS ON TRANSPARENT SUBSTRATES

(71) Applicant: Gama Sonic USA, Inc., Norcross, GA (US)

(72) Inventor: Lazar Izradel, Tel Aviv (IL)

(73) Assignee: Gama Sonic USA, Inc., Norcross, GA (US)

( * ) Notice: Subject to any disclaimer, the term of this patent is extended or adjusted under 35 U.S.C. 154(b) by 0 days.

(21) Appl. No.: 16/823,692

(22) Filed: Mar. 19, 2020

(65) Prior Publication Data

US 2020/0220493 A1 Jul. 9, 2020

Related U.S. Application Data

(63) Continuation of application No. 16/031,199, filed on Jul. 10, 2018, now abandoned.

(51) Int. Cl.
| | |
|---|---|
| *H02S 40/22* | (2014.01) |
| *F21S 9/03* | (2006.01) |
| *H01L 31/0468* | (2014.01) |
| *H01L 31/05* | (2014.01) |
| *H02S 40/38* | (2014.01) |
| *F21Y 115/10* | (2016.01) |

(52) U.S. Cl.
CPC .............. *H02S 40/22* (2014.12); *F21S 9/037* (2013.01); *H01L 31/0468* (2014.12); *H01L 31/0504* (2013.01); *H02S 40/38* (2014.12); *F21Y 2115/10* (2016.08)

(58) Field of Classification Search
CPC ..... H02S 40/22; H02S 40/38; H01L 31/0468; G02F 1/163; F21S 9/03; F21S 9/032; F21S 9/035; F21S 9/037
See application file for complete search history.

(56) References Cited

U.S. PATENT DOCUMENTS

| | | | |
|---|---|---|---|
| 7,314,287 B2 * | 1/2008 | Fan .................. | F21S 9/037 362/183 |
| 2010/0000590 A1 * | 1/2010 | Huang ................ | H01L 31/048 136/244 |

* cited by examiner

*Primary Examiner* — Daniel P Malley, Jr.
(74) *Attorney, Agent, or Firm* — Dekel Patent Ltd.; David Klein

(57) ABSTRACT

A solar panel array includes at least one solar panel including a transparent substrate on which are mounted photovoltaic cells. A battery is electrically connected to the at least one solar panel, and a light is electrically connected to the at least one solar panel.

10 Claims, 2 Drawing Sheets

SOLAR PANELS ON TRANSPARENT SUBSTRATES

CROSS-REFERENCE TO PRIOR APPLICATIONS

This application is a continuation of and claims priority from U.S. patent application Ser. No. 16/031,199, filed 10 Jul. 2018.

FIELD OF THE INVENTION

The present invention relates generally to solar panels and particularly to an array of solar panels on transparent substrates.

BACKGROUND OF THE INVENTION

Various exterior lighting systems use photovoltaic panels (solar panels) powered by batteries. Sunlight impinges on the solar panel and charges the battery or batteries during the day time. The battery can subsequently provide a source of electricity for a lighting element during the nighttime. The lighting element may be wall-mounted or pole-mounted.

Prior art solar panels have one surface facing the sun, on which the photovoltaic cells are mounted. The side which does not face the sun is sealed with an opaque color (usually black) and is typically mounted in a case or housing.

SUMMARY OF THE INVENTION

The present invention seeks to provide an array of solar panels on transparent substrates, in which both sides of the solar panels are used to generate electricity, as is described more in detail hereinbelow. In the present invention, unlike the prior art, both sides of the solar panel have light impinging thereon to generate current. Although one side may be more efficient in generating electricity from light than the other side, nevertheless the side that does not directly face the light source (e.g., the sun) is used to generate electric current.

The side that faces the light source directly is referred to as the direct side and the opposite side, which faces away from the light source, is referred to as the indirect side.

In one arrangement, there is a plurality of transparent solar panels, wherein one solar panel is opposite another solar panel. The light from the light source (e.g., sun) impinges directly on the direct side of a first one of the solar panels, passes through that solar panel and then impinges on the indirect side of the opposite solar panel. Thus, the opposite solar panel converts light to electricity from its direct side and additionally from its indirect side. A reflector (e.g., mirror) may be provided that reflects light back to the indirect side of the first solar panel so that the first solar panel also generates electricity from the direct side and the indirect side.

The solar panels can be used to provide electricity to a light fixture or other electrical components.

The solar panels may come in any shape, such as but not limited to, flat curved, concave, any other geometric shape.

There is provided in accordance with an embodiment of the invention a solar panel array including at least one solar panel including a transparent substrate on which are mounted photovoltaic cells, a battery electrically connected to the at least one solar panels, and a light electrically connected to the at least one solar panels.

In accordance with an embodiment of the invention the at least one solar panel includes a plurality of solar panels, each solar panel including a transparent substrate on which are mounted photovoltaic cells, each of the substrates including a direct side, defined as a side that directly faces a light source, and an indirect side, opposite to the direct side, which faces away from the light source, wherein a first one of the solar panels is opposite a second one of the solar panels.

In accordance with an embodiment of the invention light passing through the at least one solar panel is reflected off a reflector.

In accordance with an embodiment of the invention light passes through the first one of the solar panels and is reflected off the indirect side of the second one of the solar panels.

In accordance with an embodiment of the invention a solar panel array includes a plurality of solar panels, each solar panel including a transparent substrate on which are mounted photovoltaic cells, the substrate including a direct side, defined as a side that directly faces a light source, and an indirect side, opposite to the direct side, which faces away from the light source, wherein a first one of the solar panels is opposite a second one of the solar panels, and light from the light source impinges directly on the direct side of the first one of the solar panels, passes through the first one of the solar panels and then impinges on the indirect side of the second one of the solar panels, wherein the second one of the solar panels converts light to electricity from its direct side and additionally from its indirect side.

In accordance with an embodiment of the invention a reflector may be arranged to reflect light back to the indirect side of the first one of the solar panels so that the first one of the solar panels converts light to electricity from its direct side and additionally from its indirect side.

In accordance with an embodiment of the invention a battery is electrically connected to the solar panels. A light may be electrically connected to the solar panels.

In accordance with an embodiment of the invention more than one pair of solar panels are arranged opposite to each other.

The photovoltaic cells may be electrically connected to one another in series or parallel.

BRIEF DESCRIPTION OF THE DRAWINGS

The present invention will be understood and appreciated more fully from the following detailed description taken in conjunction with the drawings in which.

DETAILED DESCRIPTION OF EMBODIMENTS

Figure 1:
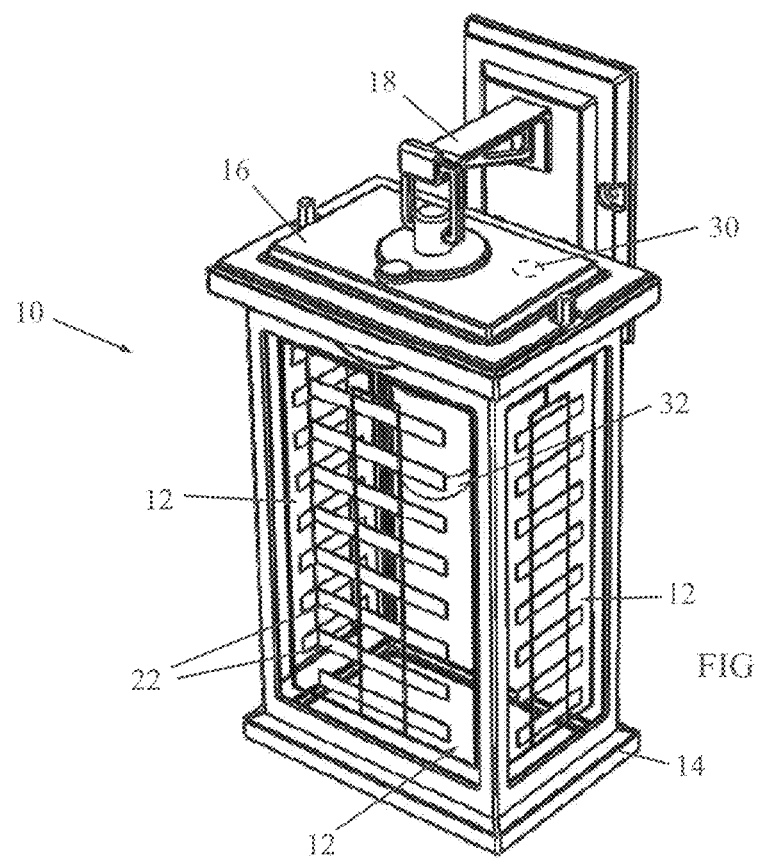
FIG. 1 is a simplified pictorial illustration of a solar panel array, constructed and operative in accordance with a non-limiting embodiment of the present invention.

Reference is now made to FIG. 1, which illustrates a solar panel array 10, constructed and operative in accordance with a non-limiting embodiment of the present invention.

The solar panel array 10 includes a plurality of solar panels 12. In the non-limiting illustrated embodiment, there are two pairs of opposite solar panels (a total of four panels). The solar panels 12 may be mounted in a frame or housing 14 provided with a cover 16 for mounting on a fixture 18, such as a wall-mounted fixture.

Each solar panel 12 includes a transparent substrate 20, such as made of glass or other suitable material (e.g., polycarbonate), on which are mounted photovoltaic cells 22. (One possible arrangement of photovoltaic cells 22 is shown in FIG. 1, but the invention is not limited to this arrangement.)

Figure 2:
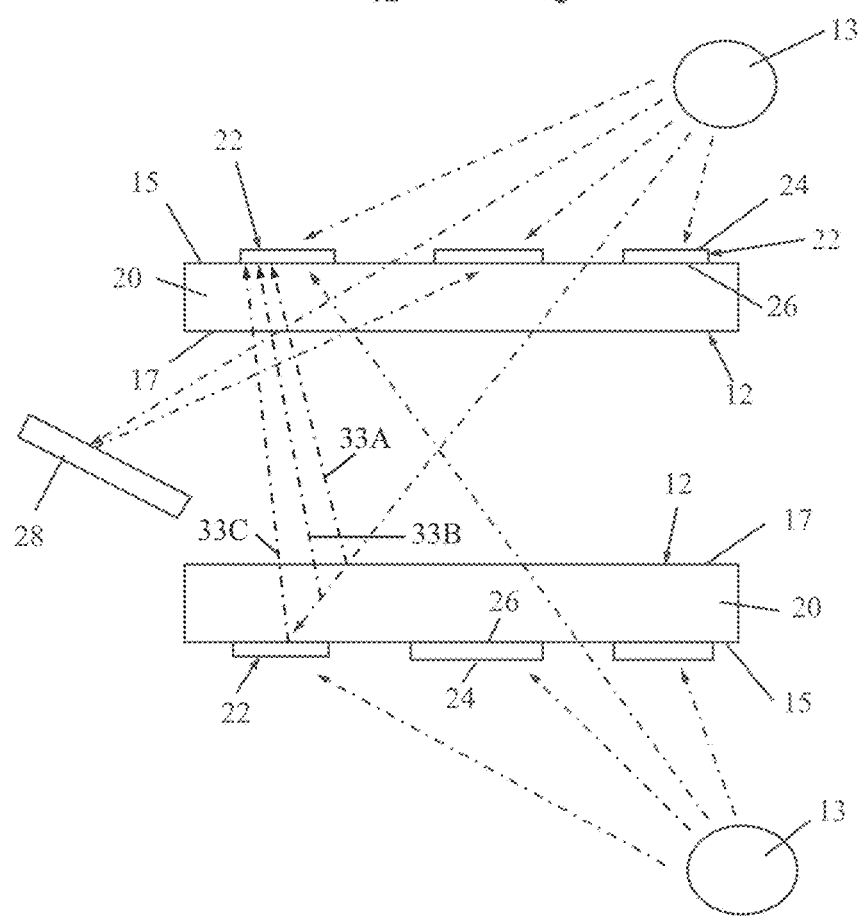
FIG. 2 is a simplified schematic illustration of light impinging on the direct and indirect sides of the solar panel with its photovoltaic cells.

Reference is now made to FIG. 2, which illustrates one pair of solar panels 12. The side of solar panel 12 that directly faces the light source 13 (e.g., sun) is referred to as the direct side 15 and the opposite side, which faces away from the light source, is referred to as the indirect side 17. The photovoltaic cells 22 are mounted on the direct side 15 of transparent substrate 20. A front face 24 of the photovoltaic cell 22 receives light directly from the light source 13. However, since the substrate 20 is transparent, light passes through substrate 20 (the top one in FIG. 2) and impinges on the indirect side 17 of the opposite solar panel 12 (the bottom one in FIG. 2), passes through substrate 20 of the bottom panel 12 and impinges on a rear face 26 of the photovoltaic cell 22 mounted on that opposite solar panel 12. Surprisingly, the inventor has discovered that the rear face 26 of the photovoltaic cell 22, although not intended for generating electricity and usually blocked in the prior art from receiving light by an opaque backing, when exposed to light passing through the thickness of the transparent substrate 20, also generates electricity.

In accordance with an embodiment of the invention a reflector 28 (e.g., mirror, flat or curved) may be arranged to reflect light back to the indirect side 17 of the first one of the pair of solar panels (the top one in FIG. 2) so that the first one of the solar panels converts light to electricity from its direct side 15 and additionally from its indirect side 17, just as the second one of the pair of solar panels (the bottom one in FIG. 2) converts light to electricity from its direct side 15 and its indirect side 17. The reflector 28 may be positioned to the side of one of the solar panels or may be positioned behind on of the solar panels (in which case, the reflected light passes through the thickness of the transparent substrate).

It is not essential to have a dedicated reflector. Instead, light can be reflected off the second one of the pair of solar panels (the bottom one in FIG. 2) back to the first one of the pair of solar panels (the top one in FIG. 2). For example, as respectively indicated by reference numerals 33A, 33B and 33C, light can be reflected off the indirect side of the second panel (33A) (and may be reflected back to the first one of the pair of solar panels or directed to another place); light can pass through a portion of the thickness of the second panel and be reflected from some surface inside the second panel (33B); or light can completely pass through the thickness of the second panel and be reflected from the back of the direct side of the second panel (33C).

The photovoltaic cells 22 may be, without limitation, monocrystalline, polycrystalline or amorphous film cells.

The solar panel array 10 generates electricity which is stored in one or more batteries 30, which are in electrical communication with solar panel array 10. The one or more batteries 30 power one or more lights 32 (such as, but not limited to, LED lights) of a light fixture. The batteries 30 may be located at the top of the fixture or at any other convenient location.

The photovoltaic cells 22 may be electrically connected to one another in series or parallel.

Instead of being completely transparent, the substrates 20 may be translucent.

Figure 3:
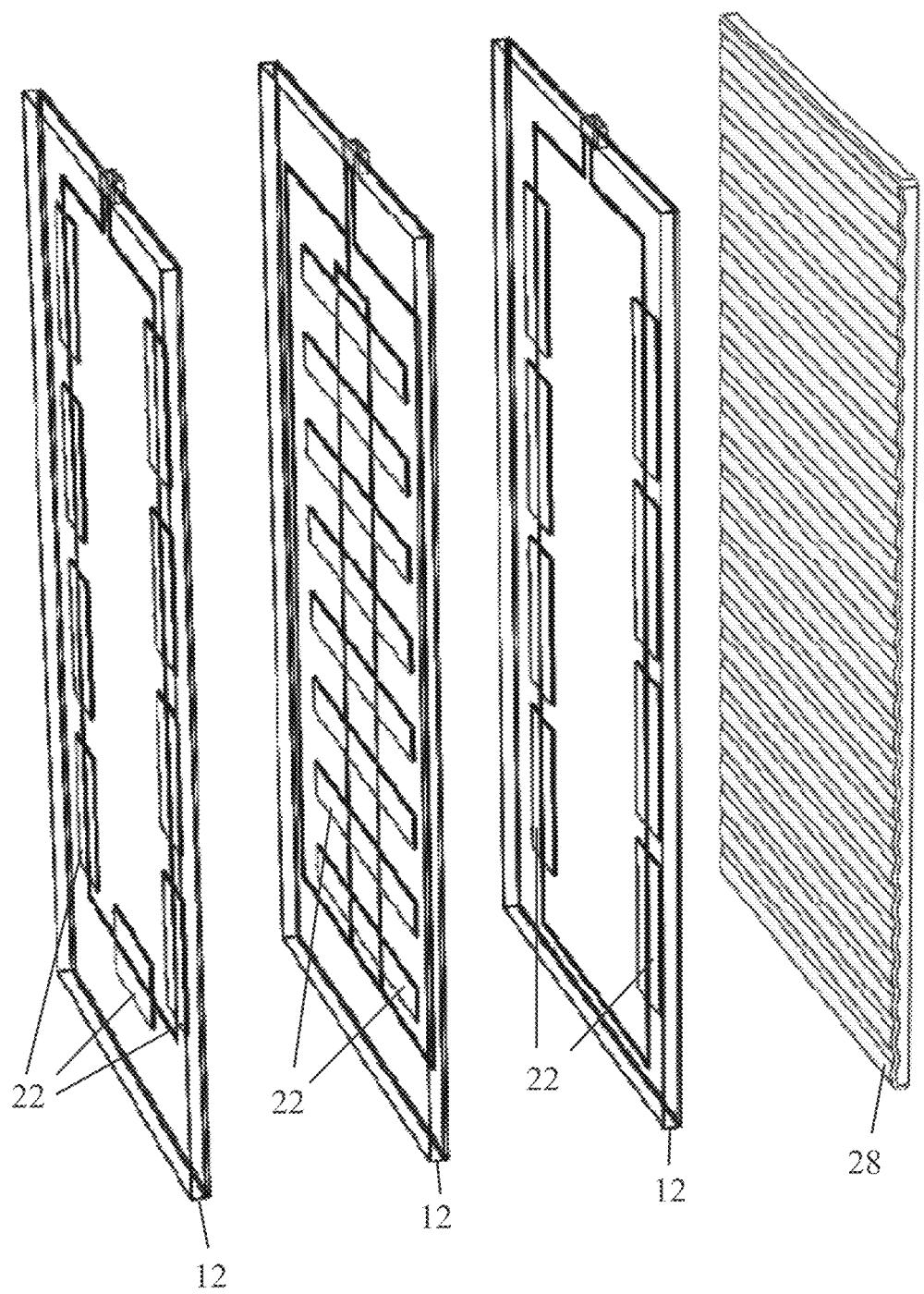
FIG. 3 is a simplified pictorial illustration of a solar panel array, in which transparent panels are placed one behind the other and light passes through one panel and impinges upon and passes through the next panel, in accordance with a non-limiting embodiment of the present invention.

Reference is now made to FIG. 3, which illustrates another solar panel array. In this arrangement, the transparent panels 12 are placed one behind the other and light passes through one panel and impinges upon and passes through the next panel. The photovoltaic cells 22 are arranged so that the photovoltaic cells 22 on a first one of the solar panels allow at least some of the light to reach the photovoltaic cells 22 on the next subsequent solar panel.

What is claimed is:

1. A method of illuminating a light with a solar panel array comprising:

having an arrangement of solar panels, each of said solar panels comprising a transparent substrate on which are mounted photovoltaic cells, wherein a battery and an electric light are electrically connected to said solar panels;

wherein each of said transparent substrates comprises a direct side, defined as a side that directly faces a light source, and an indirect side, opposite to the direct side, which faces away from the light source, wherein a first one of said solar panels is opposite a second one of said solar panels, and wherein said photovoltaic cells are mounted on the direct side of each of said transparent substrates; and wherein a light ray from said light source passes through the first one of said solar panels and impinges on the indirect side of the second one of said solar panels, passes through the transparent substrate of said second one of said solar panels and impinges on a rear face of at least one of the photovoltaic cells mounted on said second one of said solar panels so that said at least one of the photovoltaic cells mounted on said second one of said solar panels also generates electricity to power said battery and illuminate said electric light, and wherein said photovoltaic cells comprise individual photovoltaic cell strips that are separated from each other by gaps, and wherein other light rays from said light source that passes through the first one of said solar panels pass through said gaps without impinging on said photovoltaic cell strips that are on said first one of said solar panels and impinge on the rear face of at least one of the photovoltaic cells mounted on said second one of said solar panels to further generate electricity to power said battery and illuminate said electric light.

2. The method according to claim 1, wherein a light ray from said light source passes through the first one of said solar panels and is reflected as a reflected ray off the indirect side of the second one of said solar panels back to the indirect said side of the first one of said solar panels, said light ray and said reflected ray causing said photovoltaic cells on the first one of said solar panels to generate electricity to power said battery and illuminate said electric light.

3. The method according to claim 1, wherein the light ray passes through the first one of said solar panels and completely passes through a thickness of the second one of said solar panels and is reflected from a back of the direct side of the second one of said solar panels.

4. The method according to claim 1, wherein said second one of the solar panels converts light to electricity from its direct side and additionally from its indirect side.

5. The method according to claim 1, further comprising a reflector arranged to reflect light back to the indirect side of said first one of the solar panels so that said first one of the solar panels converts light to electricity from its direct side and additionally from its indirect side.

6. The method according to claim 1, comprising more than one pair of solar panels arranged opposite to each other.

7. The method according to claim 1, wherein said photovoltaic cells are electrically connected to one another in series.

8. The method according to claim 1, wherein said photovoltaic cells are electrically connected to one another in parallel.

9. The method according to claim 1, wherein said light ray passes through the first one of said solar panels and passes through a portion of a thickness of the second one of said solar panels and is reflected from some surface inside the second one of said solar panels.

10. A method of illuminating a light with a solar panel array comprising:
   providing a solar-powered electric light in an enclosure, said enclosure comprising a base and a top and solar panels that extend between said bottom and said top, said solar panels surrounding said solar-powered electric light, each of said solar panels comprising a transparent substrate on which are mounted photovoltaic cells, wherein a battery and said solar-powered electric light are electrically connected to said solar panels;
   wherein each of said transparent substrates comprises a direct side, defined as a side that directly faces a light source, and an indirect side, opposite to the direct side, which faces away from the light source, wherein a first one of said solar panels is opposite a second one of said solar panels, and wherein said photovoltaic cells are mounted on the direct side of each of said transparent substrates; and
   wherein a light ray from said light source passes through the first one of said solar panels and impinges on the indirect side of the second one of said solar panels, passes through the transparent substrate of said second one of said solar panels and impinges on a rear face of at least one of the photovoltaic cells mounted on said second one of said solar panels so that said at least one of the photovoltaic cells mounted on said second one of said solar panels also generates electricity to power said battery and illuminate said solar-powered electric light, and wherein since said solar-powered electric light is in said enclosure, some light ray is blocked by said solar-powered electric light from passing to an indirect side of one of said transparent substrates.

\* \* \* \* \*